(12) United States Patent
Kajio et al.

(10) Patent No.: US 7,782,630 B2
(45) Date of Patent: Aug. 24, 2010

(54) PRINTED CIRCUIT BOARD UNIT

(75) Inventors: Naohiko Kajio, Kawasaki (JP); Masaki Yoshimaru, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/222,232

(22) Filed: Aug. 5, 2008

(65) Prior Publication Data

US 2008/0298035 A1   Dec. 4, 2008

Related U.S. Application Data

(63) Continuation of application No. PCT/JP2006/303494, filed on Feb. 24, 2006.

(51) Int. Cl.
*H05K 7/14* (2006.01)
(52) U.S. Cl. .................. 361/788; 361/796; 361/807
(58) Field of Classification Search ................. 361/742, 361/758, 770, 788, 796, 752, 807
See application file for complete search history.

(56) References Cited

U.S. PATENT DOCUMENTS

| | | | | |
|---|---|---|---|---|
| 5,963,431 | A * | 10/1999 | Stancil | 361/803 |
| 6,061,241 | A * | 5/2000 | Handforth et al. | 361/704 |
| 6,351,719 | B1 * | 2/2002 | Harenza et al. | 702/118 |
| 6,843,657 | B2 * | 1/2005 | Driscoll et al. | 439/65 |
| 6,910,897 | B2 * | 6/2005 | Driscoll et al. | 439/65 |
| 7,019,984 | B2 * | 3/2006 | Driscoll et al. | 361/788 |
| 2004/0177201 | A1 | 9/2004 | Cherniski et al. | |
| 2006/0067066 | A1 * | 3/2006 | Meier et al. | 361/785 |

FOREIGN PATENT DOCUMENTS

| | | |
|---|---|---|
| JP | 58-102599 | 6/1983 |
| JP | 1-173698 | 7/1989 |
| JP | 5-335058 | 12/1993 |
| JP | 2004-227577 | 8/2004 |

OTHER PUBLICATIONS

International Search Report mailed May 2, 2006 in connection with the International application No. PCT/JP2006/303494.
International Preliminary Report on Patentability, mailed Sep. 4, 2008 and issued in corresponding International Patent Application No. PCT/JP2006/303494.

* cited by examiner

*Primary Examiner*—Dameon E Levi
(74) *Attorney, Agent, or Firm*—Fujitsu Patent Center

(57) ABSTRACT

A second printed wiring board is opposed to a surface of the first printed wiring board. A support member supports the first and second printed wiring boards. A first connector is mounted on the first printed wiring board. A second connector is mounted on the second printed wiring board. A wiring connects the first printed wiring board to the second printed wiring board. The first and second connectors are separately mounted on the first and second printed wiring boards, respectively. The sizes of the first and second printed wiring boards can be reduced as compared with the case where connectors are arranged in a row on a single printed wiring board, for example. This results in a reduction in the size of the printed circuit board unit. A large number of the printed circuit board units can be coupled to the back panel.

9 Claims, 9 Drawing Sheets

PRINTED CIRCUIT BOARD UNIT

CROSS REFERENCE TO RELATED APPLICATIONS

This is a continuing application, filed under 35 U.S.C. §111(a), of International Application PCT/JP2006/303494, filed Feb. 24, 2006, the contents of which are incorporated herein by reference.

BACKGROUND OF THE INVENTION

1. Field of the Invention

The present invention relates to a printed circuit board unit incorporated in an electronic apparatus such as a server computer, for example. In particular, the present invention relates to a printed circuit board unit including a printed wiring board and a connector mounted on the printed wiring board.

2. Description of the Prior Art

A server computer includes a back panel or backplane, for example. Printed circuit board units are coupled to the back panel, for example. Signal connectors and a power connector on the individual printed circuit board unit are coupled to corresponding connectors on the back panel, respectively. The signal connectors serve to enable transmission of signals between the printed circuit board units. A central processing unit (CPU) on the printed wiring board is allowed to execute processing in the individual printed circuit board unit. Electric power is supplied to the printed wiring board through the power connector.

The signal connectors and the power connector are arranged in a row on the printed wiring board. The printed wiring board must have an extent enough to cover the size of the row including the arrangement of the signal connectors and the power connector. This results in an increased extent of the printed wiring board, namely of the printed circuit board unit. The back panel is only allowed to receive a limited number of the printed circuit board units. It is preferable to mount as many printed circuit board units as possible on the back panel for execution of processing.

SUMMARY OF THE INVENTION

It is accordingly an object of the present invention to provide a printed circuit board unit contributing to a reduction in the size of a printed wiring board.

According to the present invention, there is provided a printed circuit board unit comprising: a first printed wiring board; a second printed wiring board opposed to a surface of the first printed wiring board; a support member supporting the first and second printed wiring boards; a first connector mounted on the first printed wiring board; a second connector mounted on the second printed wiring board; and a wiring connecting the first printed wiring board to the second printed wiring board.

The printed circuit board unit allows the first and second connectors to be separately mounted on the first and second printed wiring boards, respectively. The sizes of the first and second printed wiring boards can be reduced as compared with the case where connectors are arranged in a row on a single printed wiring board, for example. This results in a reduction in the size of the printed circuit board unit. A large number of the printed circuit board units can be coupled to the back panel, for example.

The second connector may be a power connector enabling supply of an operating voltage to the first printed wiring board. Electric power is thus supplied to the first printed wiring board from the second printed wiring board. The printed circuit board unit may further comprise an inrush current limiting circuit mounted on the second printed wiring board to prevent inflow of inrush current. An inrush current is thus prevented from flowing into the first and second printed wiring boards. The first and second printed wiring boards are thus prevented from getting damaged.

The printed circuit board unit may includes a cable serving as the wiring, for example. The second printed wiring board can thus be detached from the first printed wiring board in a relatively facilitated manner. In the case where a component mounted on the second printed wiring board is damaged, for example, the second printed wiring board can be replaced in a relatively facilitated manner. One is allowed to enjoy a simplified operation of repair for the printed wiring board.

A clearance may be established between the support member and the second printed wiring board so that the second printed wiring board moves along an imaginary plane perpendicular to the surface of the first printed wiring board. The second printed wiring board is thus allowed to move along the imaginary plane. The second printed wiring board is allowed to move in response to a reaction to the contact with the corresponding connector on the back panel. A positional error can be compensated between the second connector on the second printed wiring board and the corresponding connector on the back panel. The first and second connectors may be placed along an imaginary plane perpendicular to the surface of the printed wiring board.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
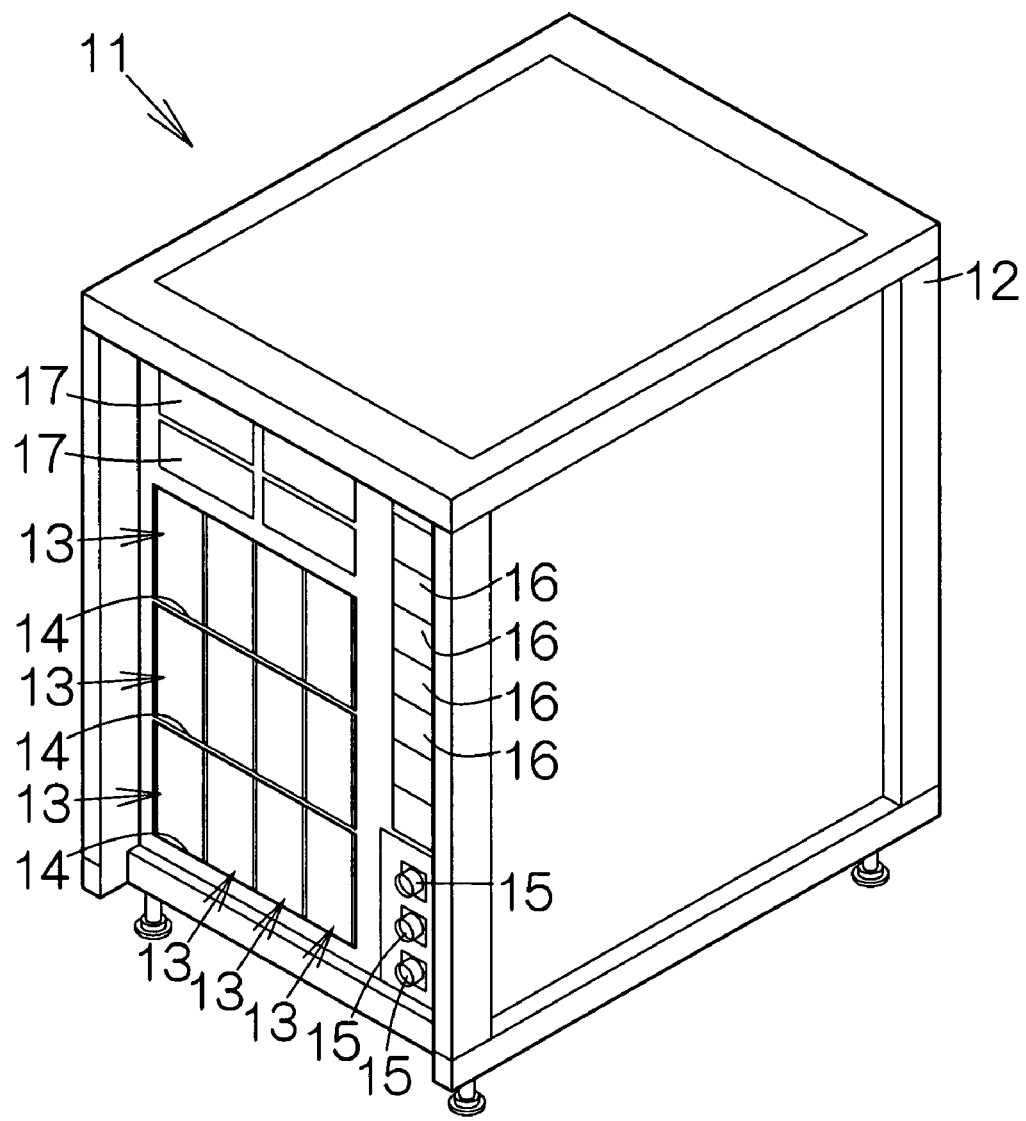
FIG. 1 is a perspective view schematically illustrating a server computer as a specific example of an electronic apparatus of the present invention.

FIG. 1 schematically illustrates a server computer 11 as a specific example of an electronic apparatus according to an embodiment of the present invention. The server computer 11 includes an enclosure 12. Twelve system board units 13, 13, .

. . are inserted into the enclosure 12 at the front side of the enclosure 12, for example. The system board units 13 are received on shelves 14 extending at the front side of the enclosure 12 in the horizontal direction in parallel with the floor, for example. A printed circuit board unit according to the present invention is incorporated in the individual system board unit 13.

Power jacks 15 and power supply units 16 are placed at the front side of the enclosure 12 at a position outside the shelves 14. A power plug, not shown, is coupled to the individual power jack 15. The power plug is connected to an outlet through a power cable. Alternating current is in this manner supplied to the server computer 11 from the outlet.

Fan units 17 are disposed at the front side of the enclosure 12. The individual fan unit 17 includes fans, not shown. The individual fan serves to generate airflow within the enclosure 12 based on the rotation of the rotors. The airflow runs in the vertical direction perpendicular to the floor from the bottom of the enclosure 12 to the top of the enclosure 12, for example. The airflow runs along the system board units 13, 13, . . . .

Figure 2:
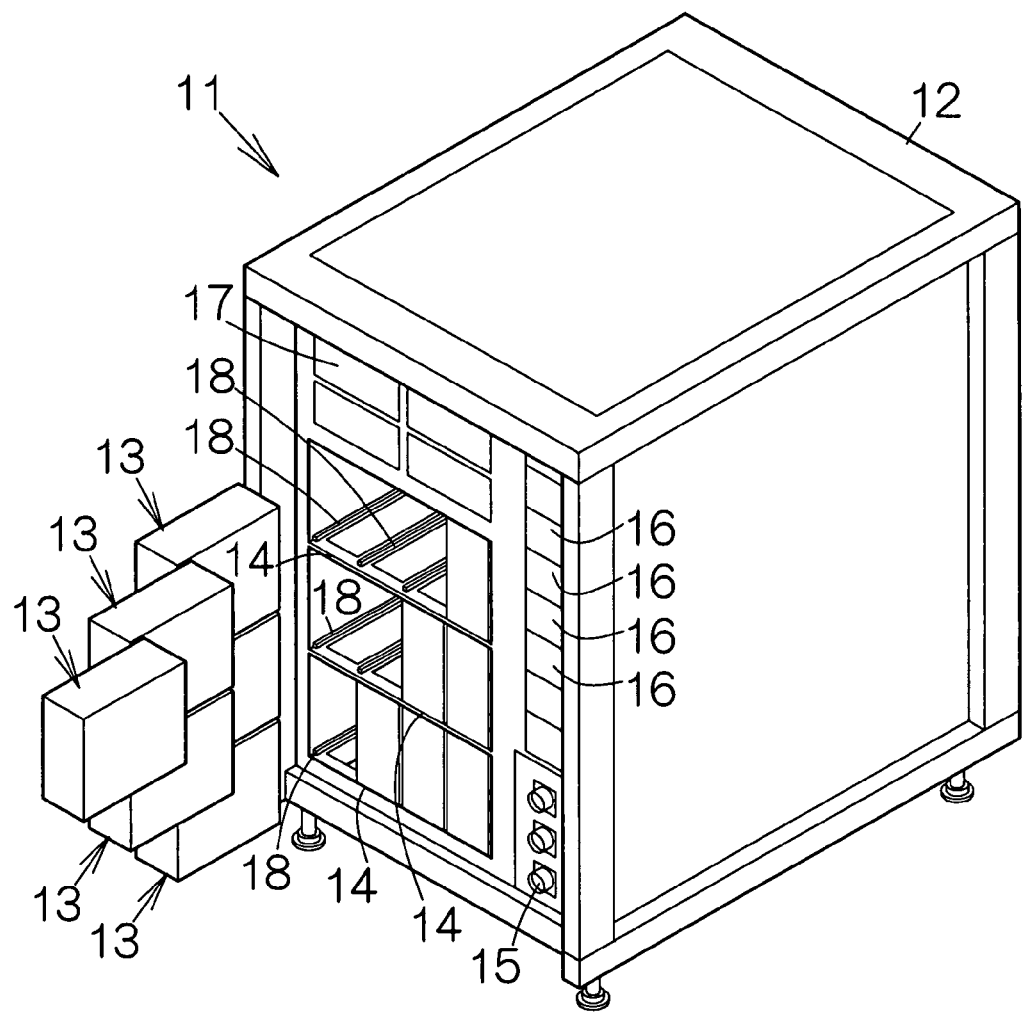
FIG. 2 is a perspective view schematically illustrating the server computer when system board units are pulled out of the server computer.

As shown in FIG. 2, the individual system board unit 13 can be pulled out of a space defined on the corresponding shelf 14. Guide rails 18, 18, . . . are disposed on the individual shelf 14. The guide rails 18 may extend rearward in the enclosure 12 in parallel with each other from the front ends located within an opening of the space on the shelf 14. The guide rails 18, 18, . . . serve to guide the movement of the system board unit 13 in the longitudinal direction of the server computer 11.

Here, a large number of fine holes, not shown, may be formed in the top plate and the bottom plate of the individual system board unit 13. Such fine holes serve as air inlets and air outlets of the system board unit 13. When the system board unit or units 13 are set on the shelf or shelves 14, the airflow penetrates through from the lowermost ones of the system board units 13 to the uppermost ones of the system board units 13 through the fine holes.

Figure 3:
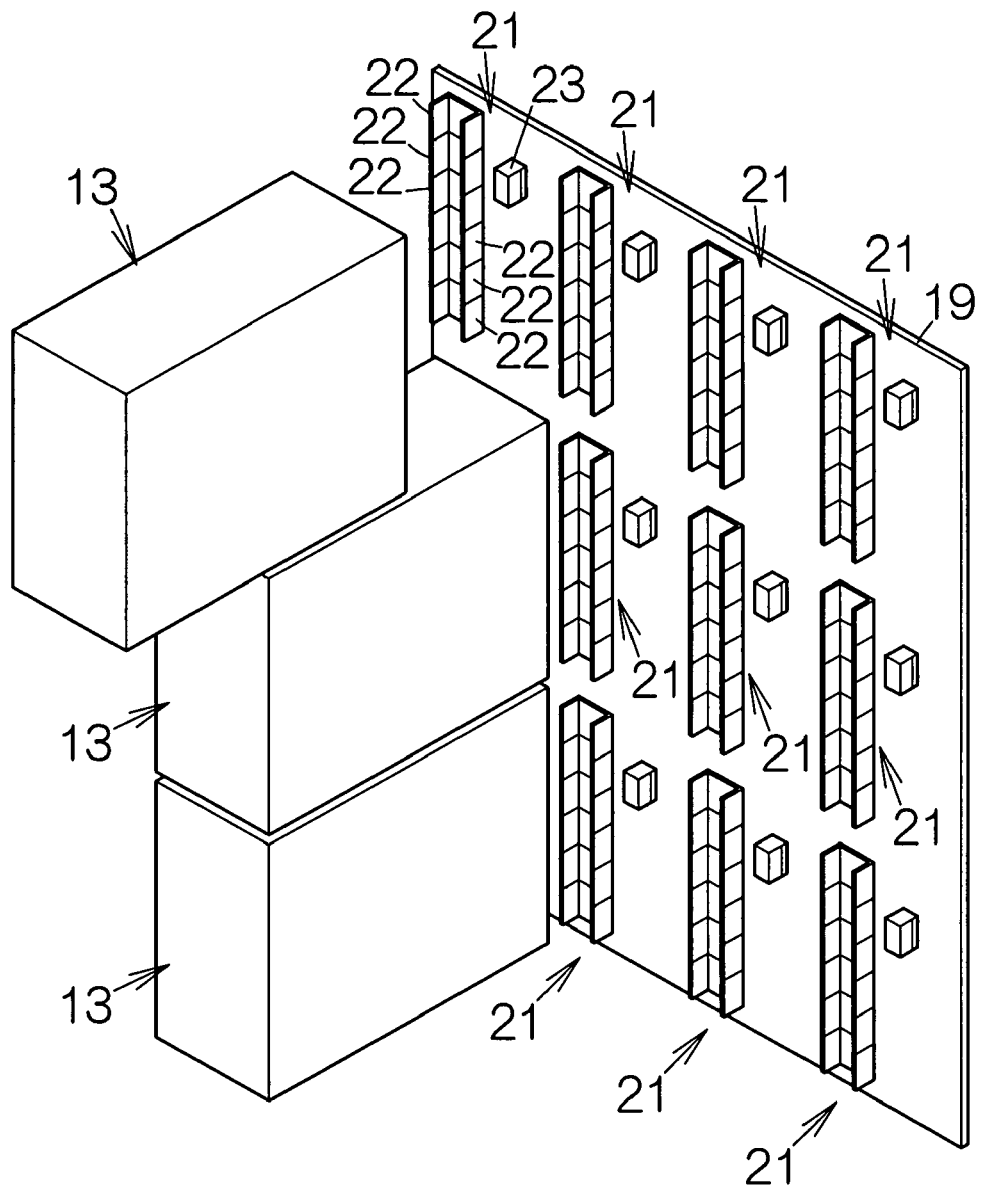
FIG. 3 is a perspective view schematically illustrating the system board units mounted on a back panel.

As shown in FIG. 3, a back panel or backplane 19 is disposed at the rear ends of the shelves 14, 14, . . . in the enclosure 12, for example. The back panel 19 is made of a resin material. The back panel 19 extends in the vertical direction perpendicular to the floor. The back panel 19 extends in parallel with the front side of the enclosure 12. The aforementioned system board units 13, 13, . . . are coupled to the back panel 19. Here, all the twelve system board units 13, 13, . . . are coupled to the back panel 19.

Connector sets 21, 21, . . . are mounted on the back panel 19. A single one of the system board units 13 is coupled to the corresponding one of the connector sets 21. Here, the connector sets 21, 21, . . . are arranged in three columns and four rows. The individual connector set 21 includes six signal connectors 22, 22, . . . and a single power connector 23. The signal connectors 22, 22, . . . are arranged in the vertical direction along the surface of the back panel 19. The power connector 23 is distanced away from the arrangement of the signal connectors 22, 22, . . . in the direction perpendicular to the arrangement of the signal connectors 22, 22, . . . , for example.

Figure 4:
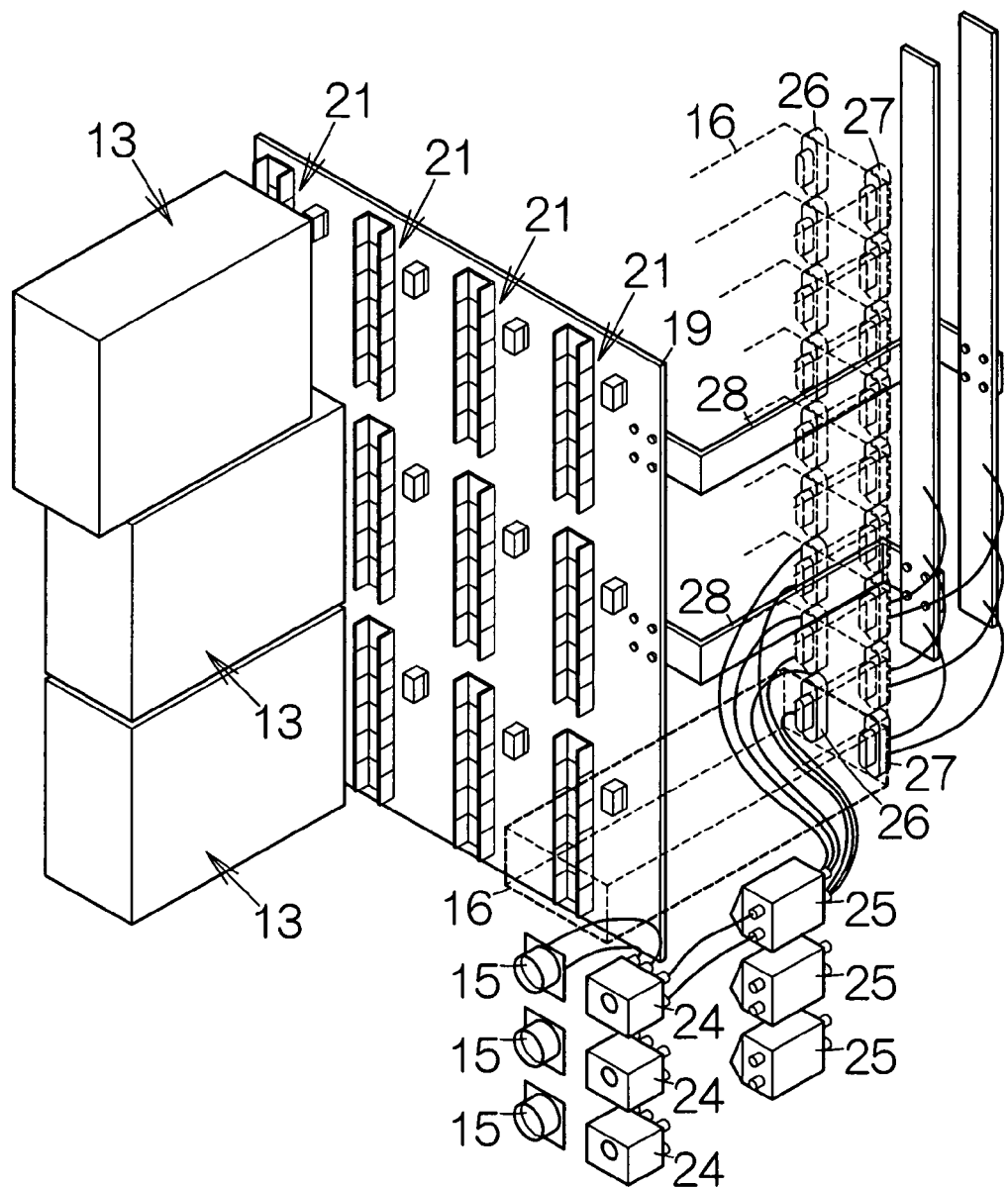
FIG. 4 is a perspective partial view schematically illustrating the structure for supply of electric current to the back panel.

As shown in FIG. 4, the power jacks 15 are connected to the power supply units 16. Breakers 24 and noise filters 25 are interposed between the power jacks 15 and the power supply units 16. The individual power supply unit 16 includes an AC (alternating current) input connector 26 and a DC (direct current) output connector 27. The AC input connector 26 of the individual power supply unit 16 is connected to the corresponding noise filter 25. Alternating current is supplied to the individual power supply unit 16 from the aforementioned outlet through the corresponding power jack 15. The power supply unit 16 serves to convert the alternating current into the direct current. Here, three of the power supply units 16 are connected to a single one of the noise filters 25.

Figure 5:
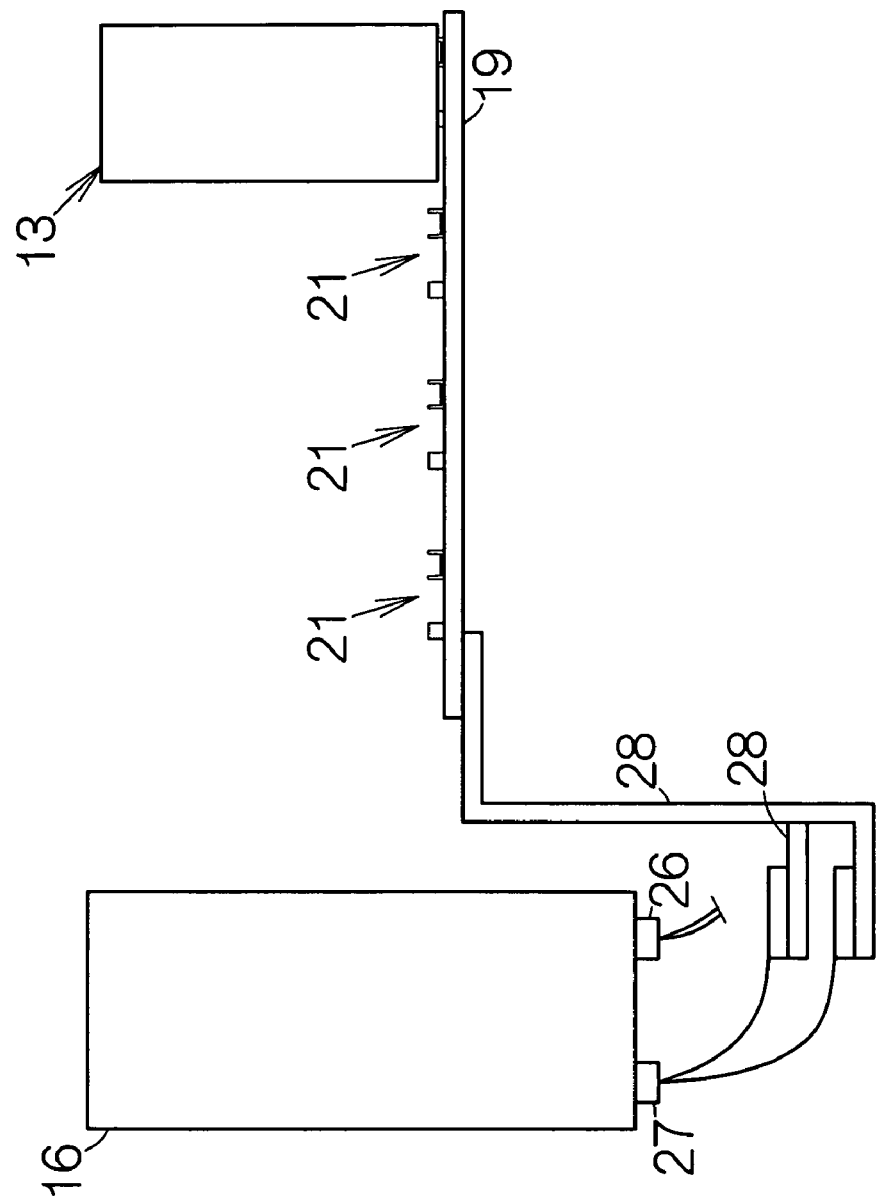
FIG. 5 is a plan view schematically illustrating the structure for supply of electric current to the back panel.

Referring also to FIG. 5, a pair of power bus bars 28, 28 is connected to the DC output connector 27 of the individual power supply unit 16. The power bus bars 28, 28 are connected to the aforementioned back panel 19. The direct current is supplied to the back panel 19 from the DC output connector 27 through one of the power bus bars 28. The direct current runs from the back panel 19 to the power supply unit 16 through the other of the power bus bars 28. The direct current is in this manner supplied to the individual system board unit 13 from the back panel 19.

Figure 6:
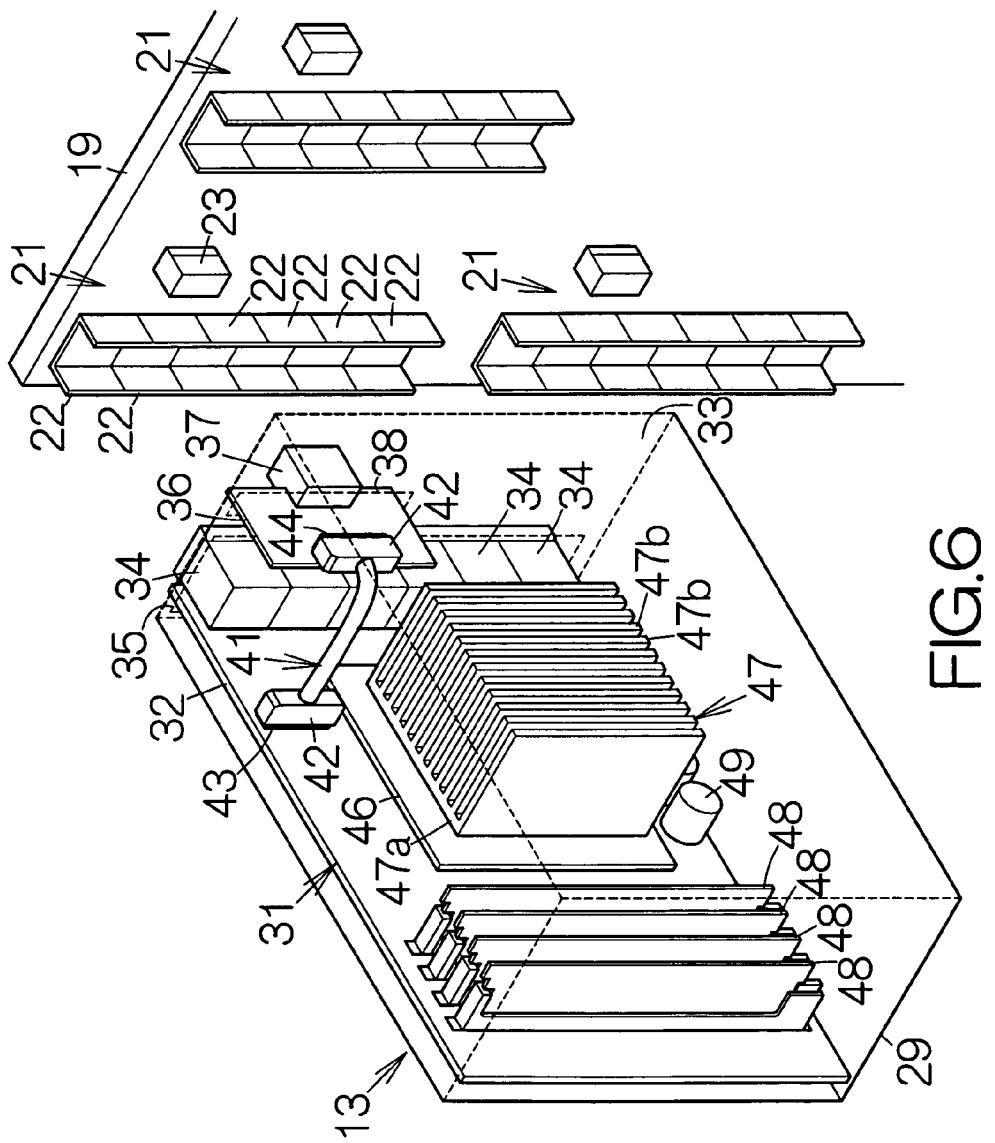
FIG. 6 is a perspective view schematically illustrating the structure of the system board unit.

As shown in FIG. 6, the individual system board unit 13 includes a box-shaped enclosure 29 defining a predetermined inner space, for example. The enclosure 29 may be made out of a metallic thin plate, for example. A printed circuit board unit 31 is enclosed in the enclosure 29. The printed circuit board unit 31 includes a first printed wiring board 32 made of a resin material, for example. The first printed wiring board 32 extends in the vertical direction perpendicular to the floor, for example. The first printed wiring board 32 may be set perpendicular to the front surface of the back panel 19, for example.

The individual printed circuit board unit 31 includes a support member, namely a front panel 33, placed at the front end of the enclosure 29. The front end of the enclosure 29 may be closed with the front panel 33. The first printed wiring board 32 is supported on the front panel 33. The front panel 33 may be placed along an imaginary plane perpendicular to the front surface of the first printed wiring board 32. The imaginary plane may be defined in parallel with the front surface of the back panel 19.

Six first connectors, namely signal connectors 34, 34, are mounted on the front surface of the first printed wiring board 32, for example. The signal connectors 34, 34, . . . are arranged in a row along the front edge of the first printed wiring board 32. The signal connectors 34, 34, . . . partially protrude out of an opening 35 defined in the front panel 33. The signal connectors 34, 34, . . . are coupled to the corresponding signal connectors 22, 22, . . . on the back panel 19, respectively. Transmission of signals is in this manner established between the system board units 13, 13.

The individual printed circuit board unit 31 includes a second printed wiring board 36 made of a resin material, for example. The second printed wiring board 36 have the back surface opposed to the front surface of the first printed wiring board 32, for example. Here, the second printed wiring board 36 may be set parallel to the first printed wiring board 32. The second printed wiring board 36 may be smaller than the first printed wiring board 32.

A second connector, namely a power connector 37, is mounted on the front surface of the second printed wiring board 36. The power connector 37 partially protrudes out of an opening 38 defined in the front panel 33. The signal connectors 34 and the power connector 37 may be placed along the aforementioned imaginary plane. The power connector 37 is coupled to the power connector 23 on the back panel 19. The direct current is supplied to the second printed wiring board 36 from the back panel 19.

The first and second printed wiring boards 32, 36 are connected to each other through a wiring, namely a power cable 41. The power cable 41 includes connectors 42, 42 at the opposite ends of the power cable 41. The connectors 42, 42 are connected to a connector 43 on the first printed wiring board 32 and a connector 44 on the second printed wiring board 36, respectively. The direct current is supplied to the first printed wiring board 32 from the second printed wiring board 36 through the power cable 41. Specifically, an operating voltage is supplied to the first printed wiring board 32 from the power connector 37.

An inrush current limiting circuit or slow start circuit, not shown, is mounted on the front surface of the second printed wiring board 36. The slow start circuit is interposed between the power connector 37 and the connector 44. The slow start circuit is capable of control the voltage value of the operating voltage supplied to the first printed wiring board 32 during the insertion of the system board unit 13 in active state. The slow start circuit serves to prevent the inflow of an inrush current to the first printed wiring board 32 from the power cable 41.

A large-scale integrated (LSI) circuit package 46 is mounted on the front surface of the first printed wiring board 32. The LSI package 46 includes a central processing unit (CPU) chip, not shown, mounted on a ceramic substrate, for example. The CPU executes various kinds of processing based on software programs and/or data temporarily held in a memory.

A heat radiating member, namely a heat sink 47, is receive on the LSI package 46. The heat sink 47 includes a plate-shaped main body, namely a heat receiver 47a and fins 47b, 47b, ... standing upright from the heat receiver 47a. Parallel air passages are defined between the adjacent ones of the fins 47b. Other electronic circuit elements such as memory units 48, 48, ... and a capacitor 49 may be mounted on the front surface of the first printed wiring board 32.

Figure 7:
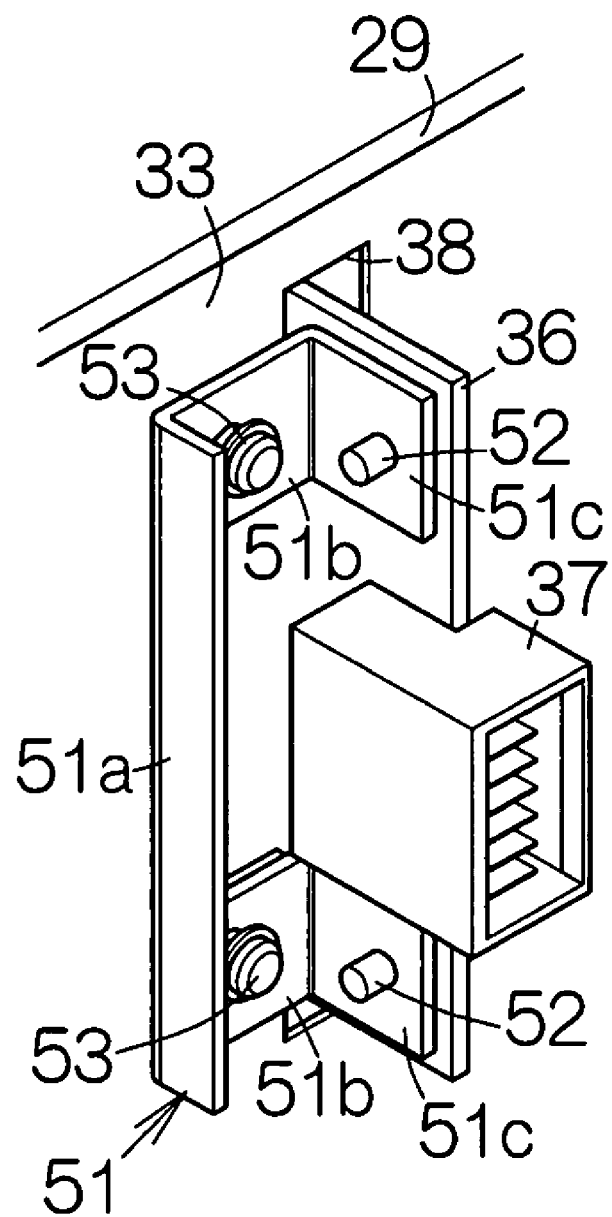
FIG. 7 is an enlarged partial perspective view schematically illustrating the structure for attachment of a second printed wiring board.

As shown in FIG. 7, an attachment piece 51 made of a metal material is fixed to the second printed wiring board 36. The attachment piece 51 defines a first plate piece 51a, a pair of second plate pieces 51b, 51b and a pair of third plate pieces 51c, 51c. The second plate pieces 51b, 51b extends from the first plate piece 51a at a right angle. The third plate pieces 51c, 51c extends from the second plate pieces 51b, 51b at a right angle, respectively. The attachment piece 51 may be made out of a single bent metallic plate.

The metal plate 51 is fixed to the front surface of the second printed wiring board 36 at the third plate pieces 51c, 51c. Screws 52, 52 may be screwed into the third plate pieces 51c, 51c and the second printed wiring board 36 from the back surface of the second printed wiring board 36, for example. The attachment piece 51 is fixed to the front panel 33 at the second plate piece 51b, 51b. Screws 53, 53 may be utilized to attach the second plate pieces 51b, 51b.

Figure 8:
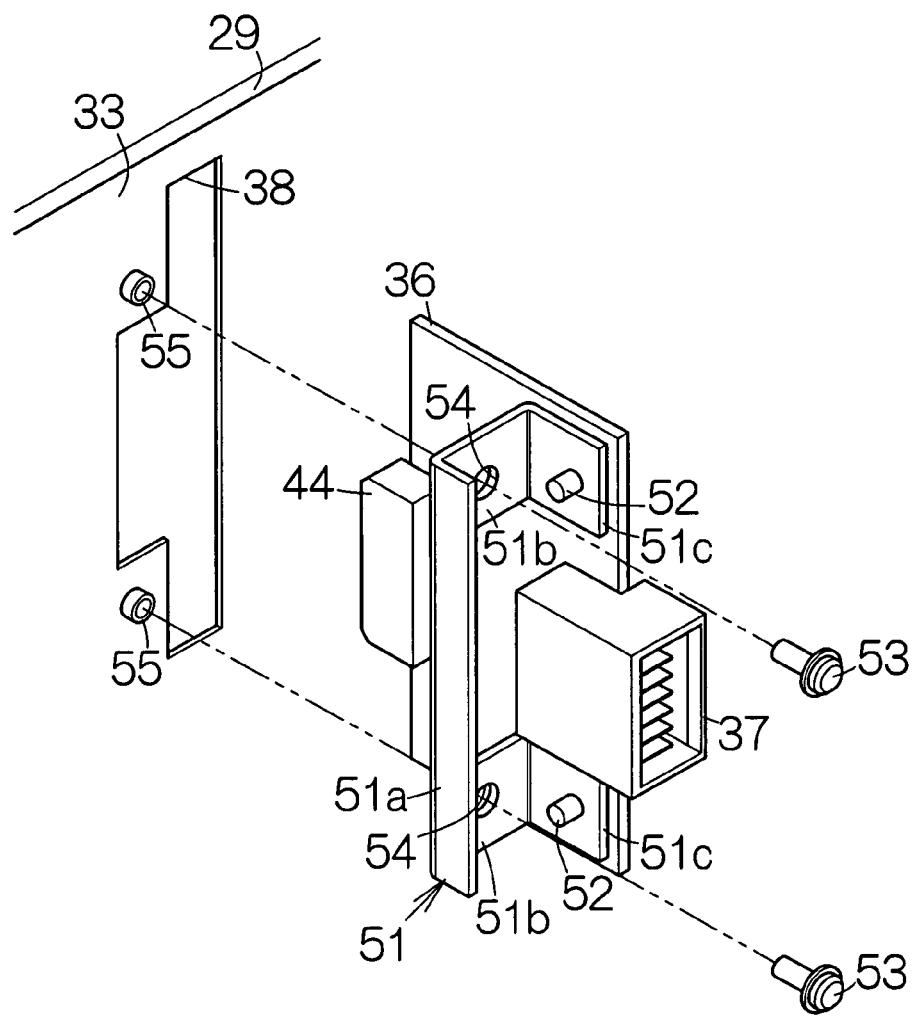
FIG. 8 is an enlarged partial exploded view schematically illustrating the structure for attachment of the second printed wiring board.

As shown in FIG. 8, a through bore 54 is formed in the individual second plate piece 51b. The through bore 54 has the cross section of a circle. The cross section is taken in parallel with the surface of the second plate piece 51b. Cylindrical studs 55, 55 are received in the corresponding through bores 54, 54 of the second plate pieces 51b, 51b, respectively. The studs 55 are designed to stand upright from the surface of the front panel 33. The screws 53, 53 are screwed into the corresponding studs 55, 55, respectively. The attachment piece 51, namely the second printed wiring board 36 is in this manner coupled to the front panel 33.

Figure 9:
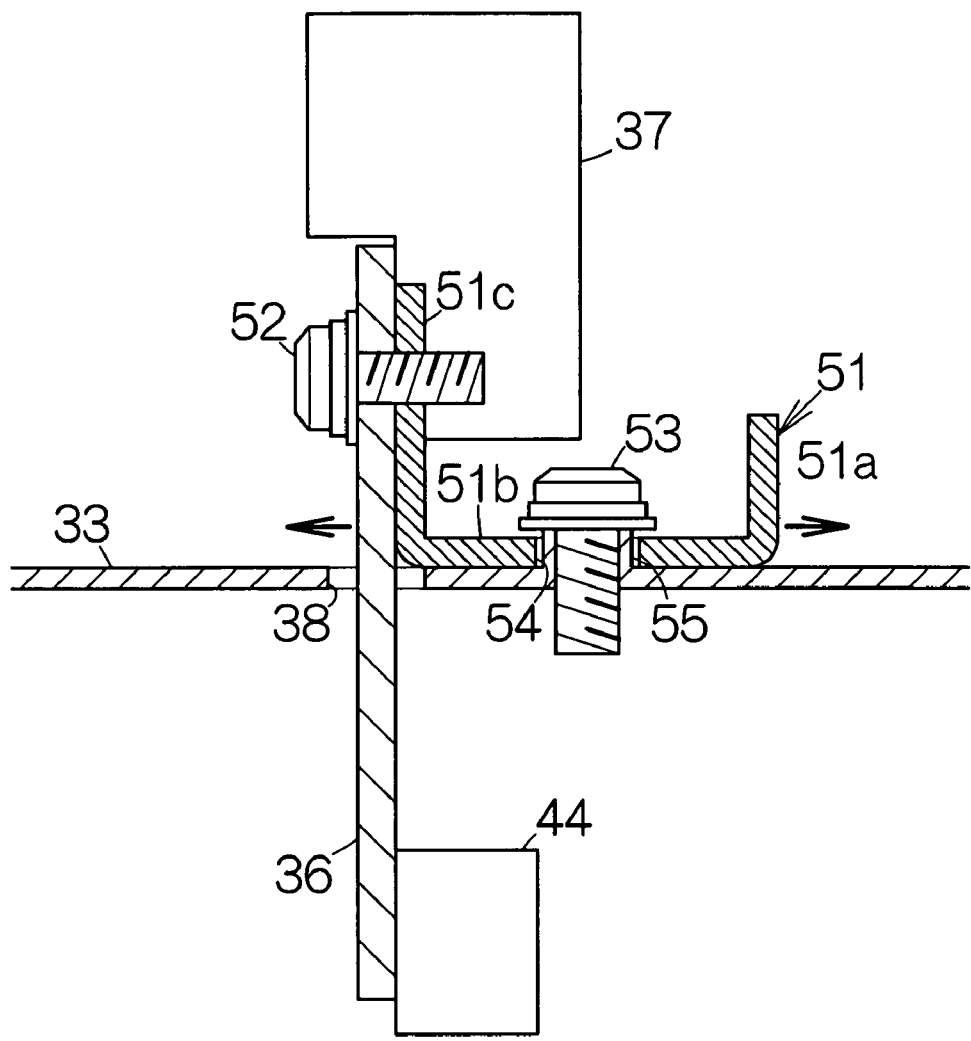
FIG. 9 is an enlarged partial view illustrating a clearance between an attachment piece and the second printed wiring board.

Referring also to FIG. 9, the inner diameter of the through bore 54 is set at 5.0 mm. The outer diameter of the stud 55 is set at 4.2 mm. A first clearance of 0.4 mm is established around the individual stud 55 inside the corresponding through hole 54. Likewise, the thickness of the attachment piece 51 is set at 1.5 mm. The height of the stud 55 from the surface of the front panel 33 is set at 2.0 mm. A second clearance of 0.5 mm is established between the screw head of the individual screw 53 and the attachment piece 51.

Such first and second clearances enable a separate displacement of the attachment piece 51, the second printed wiring board 36 and the power connector 37 along the surface of the front panel 33. A clearance larger than the aforementioned first and second clearances may be established outside the contour of the second printed wiring board 36 inside the opening 38 for realizing such displacement.

Now, assume that the system board unit 13 is to be coupled on the back panel 19 in the active state of the server computer 11. The first and second printed wiring boards 32, 36 are kept in the vertical attitude in the system board unit 13. The system board unit 13 is inserted into the space on the shelf 14 from the front of the shelf 14. When the system board unit 13 moves forward along the guide rails 18, the connectors 34, 37 of the system board unit 13 approaches the corresponding connectors 22, 23 on the back panel 19.

The forward movement of the system board unit 13 forces the signal connectors 34, 34, ... on the first printed wiring board 32 to get coupled to the signal connectors 22, 22, ... on the back panel 19, respectively. Simultaneously, the power connector 37 on the second printed wiring board 36 is coupled to the signal connector 23 on the back panel 19. The system board unit 13 in this manner coupled to the back panel 19.

The power connector 37 is allowed to move along the surface of the front panel 33 as described above. The power connector 37 is thus allowed to move in response to a reaction to the contact with the power connector 23 on the back panel 19. The power connector 37 is in this manner aligned with the power connector 23. A positional error can be compensated between the power connector 23 and the power connector 37. It should be noted that the power connector 37 may define a guide surface, not shown, to guide the power connector 23.

When the power connector 37 has been coupled to the power connector 23, the direct current is simultaneously supplied to the second printed wiring board 36 from the back panel 19. The slow start circuit serves to prevent the inflow of inrush current to the first printed wiring board 32. The direct current is supplied to the first printed wiring board 32 from the second printed wiring board 36 through the power cable 41. The signal connectors 22, 34, coupled to each other, allow the CPU on the first printed wiring board 32 of the system board unit 13 to establish transmission of signals from/to another system board unit 13.

In the individual system board unit 13, the connectors 34, 37 are separately mounted on the first and second printed wiring boards 32, 36, respectively. The size of the first printed wiring board 32 can be reduced as compared with the case where the connectors 34, 37 are arranged in a row on a single printed wiring board, for example. This results in a reduction in the size of the system board unit 13. A large number of the system board units 13, 13, ... can thus be mounted on the back panel 19.

Moreover, the second printed wiring board 36 is placed at a predetermined level above the front surface of the first printed wiring board 32. The first printed wiring board 32 is designed to receive the mounting of components such as the LSI package 46 and the heat sink 47 as described above. These components have a predetermined height from the front surface of the first printed wiring board 32. It is required to establish a certain distance between the front surface of the first printed wiring board 32 and the side panel of the enclosure 29. Even though the second printed wiring board 36 is distanced away from the front surface of the first printed wiring board 32, it is possible to prevent the enclosure 29 from suffering from an increased size.

In addition, the second printed wiring board 36 is connected to the first printed wiring board 32 through the power cable 41. It is possible to detach the second printed wiring board 36 from the first printed wiring board 32 in a relatively facilitated manner. In the case where the slow start circuit or the power connector 37 is damaged, for example, the second printed wiring board 36 can be exchanged in a relatively facilitated manner. The repair of the system board unit 13 can significantly be simplified.

What is claimed is:

1. A printed circuit board unit attached to a motherboard, the printed circuit board unit comprising:
    a first printed wiring board;
    a support panel attached to the first printed wiring board, the support panel having an opening;
    a second printed wiring board opposed to a surface of the first printed wiring board;
    a support member attached to the support panel, the support member supporting the second printed wiring board so that the second printed wiring board penetrates through the opening of the support panel;
    a first connector mounted on the first printed wiring board, the first connector connecting the first printed wiring board to the motherboard;
    a second connector mounted on the second printed wiring board, the second connector connecting the second printed wiring board to the motherboard; and
    a wiring connecting the first printed wiring board to the second printed wiring board.

2. The printed circuit board unit according to claim 1, wherein the second connector is a power connector enabling supply of an operating voltage to the first printed wiring board from the motherboard.

3. The printed circuit board unit according to claim 2, further comprising an inrush current limiting circuit mounted on the second printed wiring board to prevent inflow of inrush current from the motherboard.

4. The printed circuit board unit according to claim 1, wherein a clearance is established between the support member and the second printed wiring board so that the second printed wiring board moves along an imaginary plane perpendicular to the surface of the first printed wiring board.

5. The printed circuit board unit according to claim 1, wherein the wiring is a cable.

6. The printed circuit board unit according to claim 1, wherein the first and second connectors are placed along an imaginary plane perpendicular to the surface of the first printed wiring board.

7. The printed circuit board unit according to claim 1, wherein the motherboard is a backplane of a server computer.

8. The printed wiring board unit according to claim 1, wherein
    the support member has a through bore;
    a cylindrical projection is attached to the support panel, the cylindrical projection penetrating through the through bore; and
    a stop member is attached to a tip end of the cylindrical projection, the stop member configured to prevent the cylindrical projection from dropping out of the through bore, wherein a clearance is established between an inner surface of the through bore and an outer surface of the cylindrical projection.

9. The printed wiring board unit according to claim 1, wherein a height of the cylindrical projection is larger than an axial length of the through bore.

* * * * *